(12) United States Patent
Chen et al.

(10) Patent No.: US 9,837,504 B2
(45) Date of Patent: Dec. 5, 2017

(54) METHOD OF MODIFYING CAPPING LAYER IN SEMICONDUCTOR STRUCTURE

(71) Applicant: TAIWAN SEMICONDUCTOR MANUFACTURING CO., LTD., Hsinchu (TW)

(72) Inventors: Chun-Heng Chen, Hsinchu (TW); Wayne Liu, Taoyuan (TW); Liang-Yin Chen, Hsinchu (TW); Xiong-Fei Yu, Hsinchu (TW); Hui-Cheng Chang, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/925,657

(22) Filed: Oct. 28, 2015

(65) Prior Publication Data
US 2017/0125536 A1    May 4, 2017

(51) Int. Cl.
| | |
|---|---|
| H01L 29/49 | (2006.01) |
| H01L 21/28 | (2006.01) |
| H01L 21/324 | (2006.01) |
| H01L 29/423 | (2006.01) |
| H01L 29/66 | (2006.01) |
| H01L 29/51 | (2006.01) |

(52) U.S. Cl.
CPC .... *H01L 29/4966* (2013.01); *H01L 21/28088* (2013.01); *H01L 21/324* (2013.01); *H01L 29/42372* (2013.01); *H01L 29/66545* (2013.01); *H01L 29/42376* (2013.01); *H01L 29/513* (2013.01); *H01L 29/66636* (2013.01)

(58) Field of Classification Search
CPC .................................................. H01L 29/66545
See application file for complete search history.

(56) References Cited

U.S. PATENT DOCUMENTS

| | | | |
|---|---|---|---|
| 6,271,136 B1 * | 8/2001 | Shue | C23C 16/34 257/E21.17 |
| 6,596,643 B2 * | 7/2003 | Chen | H01L 21/28556 257/E21.17 |
| 7,067,409 B2 | 6/2006 | Tsai et al. | |
| 7,176,141 B2 | 2/2007 | Lin et al. | |
| 7,521,379 B2 | 4/2009 | Khandelwal et al. | |
| 9,136,180 B2 * | 9/2015 | Machkaoutsan | |
| 2010/0127335 A1 * | 5/2010 | Niimi | H01L 21/28088 257/368 |
| 2011/0256734 A1 * | 10/2011 | Hausmann | C23C 16/045 438/776 |
| 2015/0270142 A1 * | 9/2015 | Liu | H01L 21/321 257/369 |
| 2016/0079395 A1 * | 3/2016 | Sim | H01L 29/66795 438/283 |

* cited by examiner

*Primary Examiner* — Fernando L Toledo
*Assistant Examiner* — Valerie N Newton
(74) *Attorney, Agent, or Firm* — Maschoff Brennan (57) ABSTRACT

A method of fabricating the gate structure in a semiconductor device includes forming a gate dielectric layer over a semiconductor substrate. A capping layer is formed over the gate dielectric layer. The capping layer is treated with a first hydrogen plasma to form a first-treated capping layer. A gate electrode is formed over the first-treated capping layer. The method may further includes treating the first-treated capping layer with a nitrogen plasma.

20 Claims, 5 Drawing Sheets

METHOD OF MODIFYING CAPPING LAYER IN SEMICONDUCTOR STRUCTURE

BACKGROUND

The semiconductor industry has experienced exponential growth and has progressed in pursuit of higher device density and performance as well as lower costs. However, typical semiconductor devices face higher obstacles due to physical constraints. Accordingly, a wide variety approaches of fabrication processes for scaling down of semiconductor device have been developed.

A typical semiconductor device includes stacked components, such as an active feature including a gate layer, a gate dielectric layer and diffusion regions of source and drain regions, a capping layer, a barrier layer and so on. The fabrication of the semiconductors devices is focusing on the scaling down of dimension and arrangement of these components. For example, shorting the gate length or the distance between the gate stacks may result in various issues in the fabrication of the semiconductor device.

BRIEF DESCRIPTION OF THE DRAWINGS

Aspects of the instant disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the instant disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the instant disclosure may repeat reference numerals and/or letters in the various examples. This repetition is for the purpose of simplicity and clarity and does not in itself dictate a relationship between the various embodiments and/or configurations discussed.

The singular forms "a," "an" and "the" include plural referents unless the context clearly dictates otherwise. Therefore, reference to, for example, a gate includes aspects having two or more such gate, unless the context clearly indicates otherwise. Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In order to fulfill a requirement of forming conformal layers for scaling down of semiconductor devices, many layers such as capping layers, barrier layers and gate layers of a semiconductor device are formed by a chemical vapor deposition (CVD) process or an atomic layer deposition (ALD) process. During deposition, impurities such as oxygen, either from reaction gas or precursors, tend to remain in the deposited layers such that the quality of the deposited layers may be degraded. Accordingly, the deposited layers are usually treated with a high temperature annealing process for purification and densification of these layers. Generally, a temperature of traditional annealing process ranges from 800° C. to 1200° C.

But such high temperature may induces some side effects. For example, an equivalent oxide thickness (EOT) of a gate structure may be increased after annealing at such high temperature if the annealing ambient is not well controlled. The semiconductor device performance may be negatively affected. Even the annealing ambient can be fully controlled, some deposited layers having worse thermal stability may restrict the annealing conditions. For example, high temperature annealing may lead to un-tunable work function in a gate structure due to inter-diffusion. Furthermore, in the semiconductor device, non-silicon channel materials, e.g., Ge, III-V (e.g., InGaAs, InP), have high mobility but much lower thermal stability than Si. Even the thermal stability of gate structure can be improved through doping or other approaches such that the gate structure can sustain such high temperature, the intrinsic problem of the channel materials still exists. Consequently, the high temperature annealing may not suitable for non-silicon channel devices.

To solve the above-mentioned problems, the instant disclosure provides a gate structure, a method of fabricating the same and a method of modifying a capping layer in a semiconductor structure, which is beneficial for reducing the thermal budget and obtaining deposited layers of high quality. Therefore, the performance of semiconductor device may be improved.

Figure 1A:
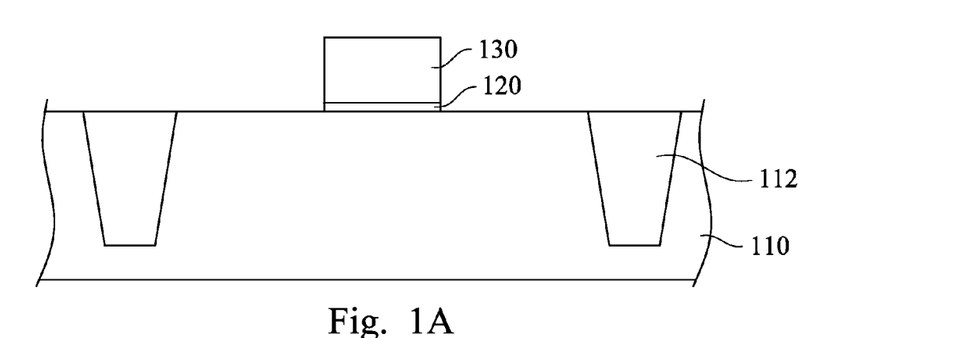
FIGS. 1A to 1G are cross-sectional views at various stages of a method of fabricating a gate structure in a semiconductor device in accordance with some embodiments of the instant disclosure.

FIGS. 1A to 1G are cross-sectional views at various stages of a method of fabricating a gate structure in a semiconductor device in accordance with some embodiments of the instant disclosure. Referring to FIG. 1A, a substrate 110 having a shallow trench isolation (STI) feature 112 formed therein, an patterned interfacial layer 120 and a dummy gate 130 are provided. The substrate 110 may be a semiconductor substrate, semiconductor on insulator (SOI) substrate, graphene-on-silicon substrate, III-V group-on-silicon (such as GaN on-silicon) substrate or silicon substrate. The STI feature 112 may be formed by etching or otherwise forming a recess in the substrate 110, subsequently filling the recess with dielectric material such as silicon dioxide ($SiO_2$) and possibly planarizing by a chemical mechanical polishing (CMP) process.

Further, an interfacial layer is formed over the substrate 110 and the STI feature 112, and a polysilicon layer that used to form a dummy gate is subsequently formed over the interfacial layer. Next, the interfacial layer and the polysilicon layer may be patterned by etching to form the patterned interfacial layer 120 and the dummy gate 130. In some embodiments, the interfacial layer may substantially includes silicon oxide, silicon nitride, silicon oxynitride, carbon doped silicon dioxide, nitrided silicon dioxide or a combination thereof.

Figure 1B:
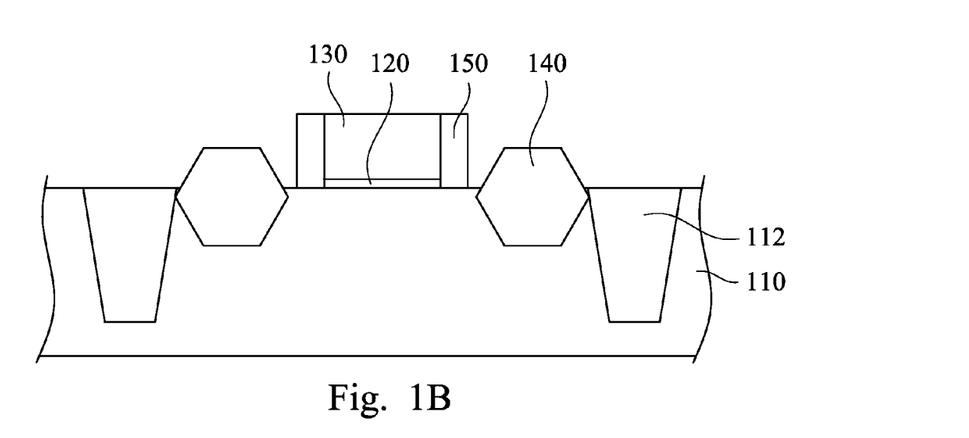

Referring to FIG. 1B, source/drain regions 140 are formed in the substrate 110 on opposite sides of the dummy gate 130 and a pair of spacers 150 are formed by chemical vapor deposition (CVD) along the opposite sidewalls of the dummy gate 130. In some embodiments, the source/drain regions 140 are formed by epitaxial growth process. In another embodiments, the source/drain regions 140 are formed by implantation.

Figure 1C:
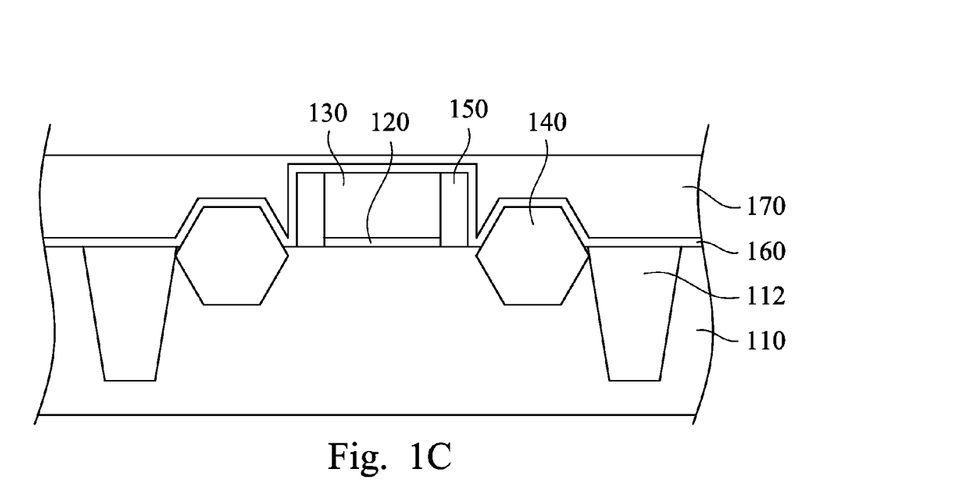

Referring to FIG. 1C, an etch stop layer (ESL) 160 is formed over the dummy gate 130 and an interlayer dielectric layer (ILD) 170 is subsequently formed over the etch stop layer 160. The interlayer dielectric layer 170 may includes low-k material which has a k value less than 3.0, and may be formed by spin coating or chemical vapor deposition (CVD) such as organosilicate glass (OSG) or carbon-doped oxide (CDO). Such low-k dielectric materials result in lower capacitance, faster switching and faster signal transmission.

Figure 1D:
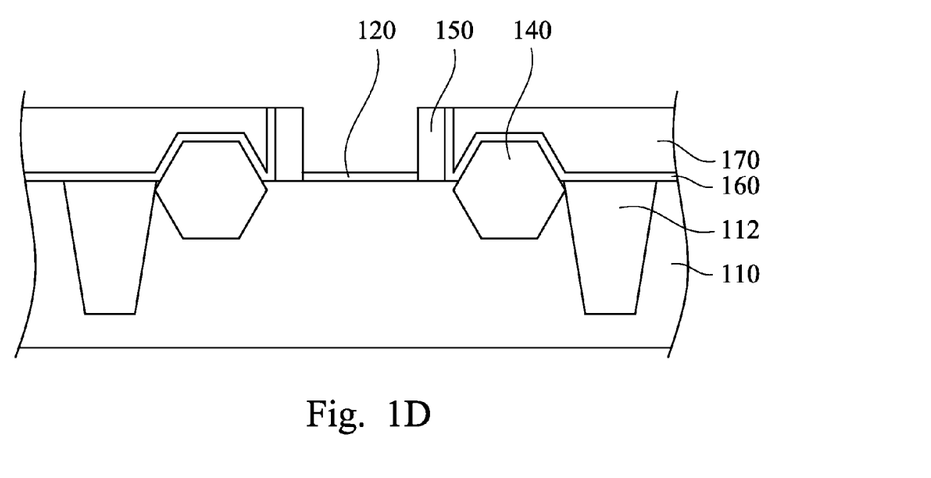

Referring to FIG. 1D, the etch stop layer 160 and the interlayer dielectric layer 170 are planarized to remove portions of interlayer dielectric layer 170 and the etch stop layer 160 to expose the dummy gate 130. Then, the dummy gate 130 between the spacers 150 is removed to form an opening corresponding to where the dummy gate 130 has been formed. Therefore, the remaining portions of spacers 150 and the patterned interfacial layer 120 between the spacers 150 are exposed through the opening. The etch stop layer 160 may includes silicon dioxide ($SiO_2$), hafnium dioxide ($HfO_2$), silicon carbide (SiC), carbon-doped silicon oxide, carbon-doped silicon nitride and/or other materials.

Figure 1E:
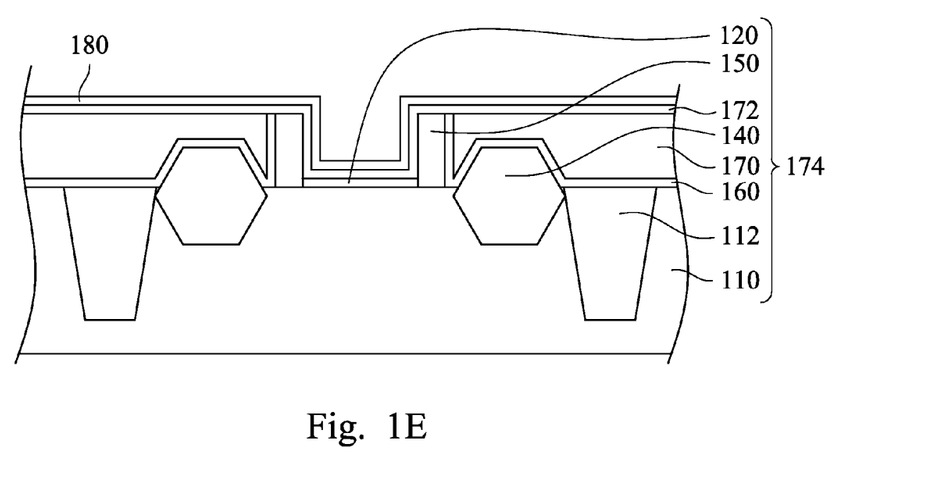

Referring to FIG. 1E, a gate dielectric layer 172 is formed over the patterned interfacial layer 120, spacers 150, the etch stop layer 160 and the interlayer dielectric layer 170. The gate dielectric layer 172 may be conventionally deposited or otherwise formed, and may be a high k dielectric layer including a material of scandium oxide ($Sc_2O_3$), aluminium oxide ($Al_2O_3$), titanium oxide ($TiO_2$), barium strontium titanium oxide ($BaO_6SrTi_2$), yttrium oxide ($Y_2O_3$), zirconium oxide ($ZrO_2$), zirconium silicon oxide (ZrSiO4), lanthanum oxide ($La_2O_3$), hafnium oxide ($HfO_2$), hafnium silicon oxide, tantalum pentoxide ($Ta_2O_5$), strontium titanium oxide ($SrTiO_3$), lead scandium tantalum oxide, lead zinc niobate (PZN) or a combination thereof. In some embodiments, the gate dielectric layer 172 may includes various dielectric materials, either individually or in combination. Next, a capping layer 180 is formed over the gate dielectric layer 172 and may be formed by atomic layer deposition (ALD), chemical vapor deposition (CVD), low pressure chemical vapor deposition (LPCVD) or monolayer deposition (MLD). The capping layer 180 may be made of any suitable high k material. Examples of the high k material include but not limited to TiN, TaN, AlN, SiN, TiC, TaC, AlC, SiC or a combination thereof. In some embodiments, the capping layer 180 has a thickness less than about 25 angstrom. In other words, after an underlying structure 174 including the substrate 110, the STI feature 112, the patterned interfacial layer 120, the source/drain regions 140, the spacers 150, the etch stop layer 160, the interlayer dielectric layer 170 and the gate dielectric layer 172, is received, the capping layer 180 is formed over the underlying structure 174.

Figure 1F:
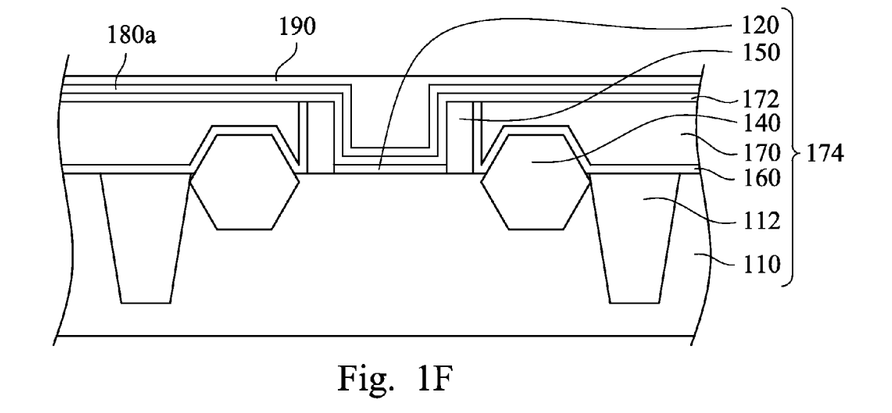

In some embodiments, referring to FIG. 1F, after the capping layer 180 is formed over the gate dielectric layer 172 shown in FIG. 1E, the capping layer 180 is treated with a first hydrogen plasma to form a first-treated capping layer 180a shown in FIG. 1F. The first-treated capping layer 180a refers to the capping layer treated with hydrogen plasma. In some embodiments, the first hydrogen plasma is generated in an ambient with pure hydrogen gas ($H_2$) which has a flow in a range from about 100 standard cubic centimeter per minute (sccm) to about 3 standard liter per minute (SLM). Further, a power of the first hydrogen plasma may in a range from 250 to 2000 W and a process time of the first hydrogen plasma may in a range from 10 to 100 seconds. Higher power can convert more hydrogen gas to hydrogen plasma. In another embodiments, a power of the first hydrogen plasma is in a range from 500 to 1000 W. A pressure of the first hydrogen plasma may in a range from 20 mT to 10 T. In another embodiments, a pressure of the first hydrogen plasma is in a range from 100 mT to 200 mT. Furthermore, the capping layer 180 may treated with the first hydrogen plasma at a temperature ranging from about 20° C. to about 600° C. In another embodiments, the capping layer 180 is treated with the first hydrogen plasma at a temperature ranging from about 20° C. to about 400° C. The ambient temperature of first hydrogen plasma of instant disclosure is much lower than the traditional high temperature annealing process such that the first-treated capping layer 180a can fulfill the requirement of low thermal budget.

The first hydrogen plasma comprising some charged particles, such as protons and electrons, is a very strong reducing agent. Therefore, the first hydrogen plasma is capable of removing the impurites in the capping layer 180. The first hydrogen plasma may breaks the bonds between impurites and the material of the capping layer 180, and then first hydrogen plasma may combines with the impurities. Thus, the impurities may leave the capping layer 180 such that the remaining elements could form new bondings. For example, the capping layer 180 is made of TiN and may includes some impurities such as oxygen. Therefore, some Ti atoms may bond with some O atoms to form some undesirable Ti—O bonds. Through the first hydrogen plasma treatment, the Ti—O bonds may be broken by the first hydrogen plasma and the first hydrogen plasma then combines with the O atoms to form water. Those remaining Ti atoms may form new bonds with each other such as Ti—Ti bonds or may form new bonds with N atoms such as Ti—N bonds. In other words, the first-treated capping layer 180a is modified and densificated by the first hydrogen plasma treatment.

In some embodiments, the capping layer 180 made of a material of TiN is formed by ALD process. Then, a ratio of Ti—N bonds and Ti—O bonds of the capping layer 180 or the first-treated capping layer 180a may be obtained by a x-ray photoelectron spectroscopy (XPS). For the capping layer 180 without first hydrogen plasma treatment, the ratio of Ti—N bonds and Ti—O bonds of the capping layer 180 is about 0.3. However, after the capping layer 180 is treated with the first hydrogen plasma, the ratio of Ti—N bonds and Ti—O bonds of the first-treated capping layer 180a is about 1.7. These datas verify that the first hydrogen plasma could effectively break the Ti—O bonds and remove the impurities in the capping layer 180. Accordingly, the first-treated capping layer 180a is an oxygen-deficient capping layer.

In some embodiments, in order to regulate the flow of the hydrogen gas, the first hydrogen plasma further includes a dilution gas in the first hydrogen plasma to dilute the hydrogen gas. In other word, the first hydrogen plasma may be generated by a diluted hydrogen gas but the dilution gas may not be ionized. The dilution gas may includes any suitable inert gas. Examples of the dilution gas include but not limited to He, Ne, Ar, $N_2$ or a combination thereof. In some embodiments, a ratio of hydrogen gas flow and total gas flow may ranges from 1% to 99%. In another embodiments, a ratio of hydrogen gas flow and total gas flow may ranges from 5% to 10%.

Referring to FIG. 1F, a gate layer 190 is formed over the first-treated capping layer 180a. The gate layer 190 may be made of any suitable material. Examples of the material include but not limited to Mo, Ru, Ti, Os, Re, Rh, Ir, Pt, Ta, In, Cd, Ag, Al, Nb, nitrides of the above-mentioned metals, carbides of the above-mentioned metals or a combination thereof. As shown in FIG. 1F, the etch stop layer 160, the interlayer dielectric layer 170, the gate dielectric layer 172, the first-treated capping layer 180a and the gate layer 190 form a multilayer stack. In some embodiments, the gate layer 190 is a gate electrode.

Figure 1G:
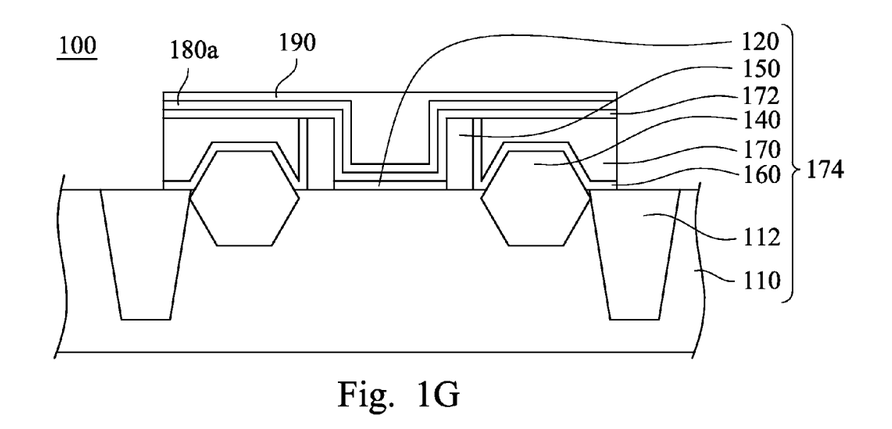

Referring to FIG. 1G, the multilayer stack is patterned to form a semiconductor device 100 by any conventional method such as etching. The gate dielectric layer 172, first-treated capping layer 180a and gate layer 190 forms a gate stack. In some embodiments, the gate stack is a high k metal gate (HKMG) stack. Further, in some embodiments, the semiconductor device 100 is a complementary metal-oxide-semiconductor (CMOS) device. A gate structure of instant disclosure refers to a structure including a gate layer such that a structure of a semiconductor device including the gate layer belongs to the gate structure. In some embodiment, the structure of semiconductor device 100 is a gate structure.

Figure 2:
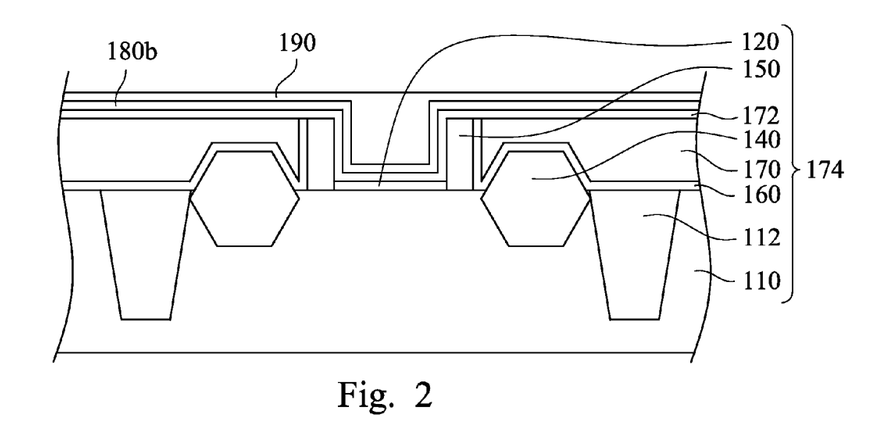
FIG. 2 is a cross-sectional view at a stage of a method of fabricating a gate structure in a semiconductor device in accordance with some embodiments of the instant disclosure.

FIG. 2 is a cross-sectional view at a stage of a method of fabricating a gate structure in a semiconductor device in accordance with some embodiments of the instant disclosure. After the capping layer 180 is formed over the gate dielectric layer 172 shown in FIG. 1E, the capping layer 180 is treated with a first hydrogen plasma to form a first-treated capping layer. Then, the first-treated capping layer is further treated with a first nitrogen plasma to form a second-treated capping layer 180b shown in FIG. 2 because the first nitrogen plasma process is a nitriding process. The first nitrogen plasma process provides an environment rich in nitrogen and the nitrogen may diffuses into the nitrogen plasma treated layer. The second-treated capping layer 180b refers to the capping layer treated with hydrogen plasma and nitrogen plasma. Therefore, the second-treated capping layer 180b is also oxygen-deficient. The gate dielectric layer 172, second-treated capping layer 180b and gate layer 190 form a gate stack. In some embodiments, the gate stack is a HKMG stack. Further, the etch stop layer 160, the interlayer dielectric layer 170, the gate dielectric layer 172, the second-treated capping layer 180b and the gate layer 190 shown in FIG. 2 may be further patterned to form a semiconductor device such as CMOS device as described in FIG. 1G.

The first nitrogen plasma is generated in an ambient with a nitrogen-containing gas comprising $NH_3$, $N_2$ or both and includes highly active nitrogen-containing gas with ionized molecules. In some embodiments, the first nitrogen plasma has a flow in a range from about 100 sccm to about 3SLM. Further, a power of the first nitrogen plasma may in a range from 250 to 2000 W and a process time of the first nitrogen plasma may in a range from 10 to 100 seconds. Higher power can convert more nitrogen-containing gas to nitrogen plasma. In another embodiments, a power of the first nitrogen plasma is in a range from 500 to 1000 W. A pressure of the first nitrogen plasma may in a range from 20 mT to 10 T. In another embodiments, a pressure of the first nitrogen plasma is in a range from 100 mT to 200 mT. Furthermore, the first-treated capping layer 180a is treated with the first nitrogen plasma at a temperature ranging from about 20° C. to about 600° C. In another embodiments, the first-treated capping layer 180a is treated with the first nitrogen plasma at a temperature ranging from about 20° C. to about 400° C. The ambient temperature of first nitrogen plasma of instant disclosure is much lower than the traditional annealing process such that the second-treated capping layer 180b can fulfill the requirement of low thermal budget.

In some embodiments, in order to regulate the flow of the nitrogen-containing gas, the first nitrogen plasma further includes a dilution gas in the first nitrogen plasma to dilute the nitrogen-containing gas. In other word, the first nitrogen plasma may be generated by diluted nitrogen-containing gas. The dilution gas may includes He, Ne, Ar, $O_2$, $H_2$ or a combination thereof. In some embodiments, a ratio of nitrogen-containing gas flow and total gas may ranges from 1% to 99%. In another embodiments, a ratio of nitrogen-containing gas flow and total gas may ranges from 5% to 10%.

Therefore, based on the descriptions in FIGS. 1A-1G and FIG. 2, the capping layer may be treated with the first hydrogen plasma process to form the first-treated capping layer 180a shown in FIG. 1F or be treated with first hydrogen plasma process and first nitrogen plasma process to form the second-treated capping layer 180b shown in FIG. 2.

Figure 3A:
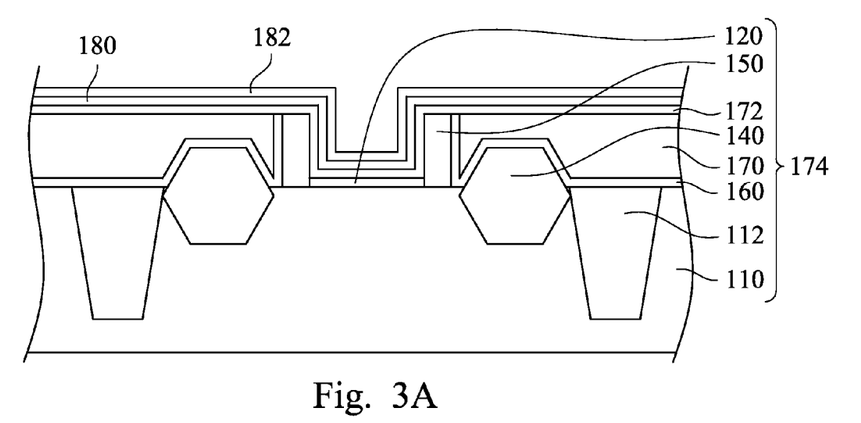
FIGS. 3A to 3B are cross-sectional views at various stages of a method of fabricating a gate structure in a semiconductor device in accordance with some embodiments of the instant disclosure.
Figure 3B:
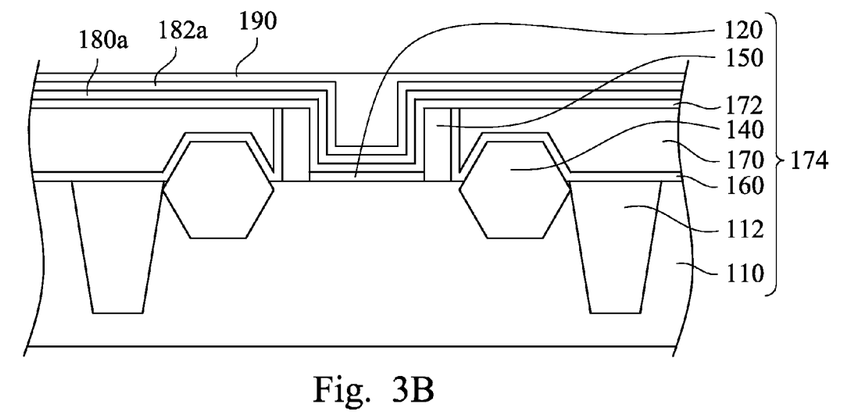

FIGS. 3A to 3B are cross-sectional views at various stages of a method of fabricating a gate structure in a semiconductor device in accordance with some embodiments of the instant disclosure. Referring to FIG. 3A, a first barrier layer 182 is formed over the capping layer 180. The first barrier layer 182 may be formed by atomic layer deposition (ALD), chemical vapor deposition (CVD), low pressure chemical vapor deposition (LPCVD) or monolayer deposition (MLD). The first barrier layer 182 may be made of any suitable material. Examples of the material include but not limited to TiN, TaN, AlN, TiC, TaC, AlC or a combination thereof. In some embodiments, the first barrier layer 182 has a thickness less than about 20 angstrom.

After the capping layer 180 and the first barrier layer 182 are formed over the gate dielectric layer 172 shown in FIG. 3A, the capping layer 180 and the first barrier layer 182 are treated with the first hydrogen plasma simultaneously to form a first-treated capping layer 180a and a first-treated first barrier layer 182a shown in FIG. 3B. The first-treated first barrier layer 182a refers to the first barrier layer treated with hydrogen plasma. Next, a gate layer 190 is formed over the first-treated first barrier layer 182a. In some embodiments, the first hydrogen plasma is generated in an ambient with pure hydrogen gas ($H_2$) or with a diluted hydrogen gas. In some embodiments, the first hydrogen plasma process is similar to that described above in FIGS. 1E-1F. The gate dielectric layer 172, first-treated capping layer 180a, first-treated first barrier layer 182a and gate layer 190 form a gate stack. In some embodiments, the gate structure is a HKMG stack. Further, the etch stop layer 160, the interlayer dielectric layer 170, the gate dielectric layer 172, the first-treated capping layer 180a, first-treated first barrier layer and the gate layer 190 shown in FIG. 3B may be further patterned to form a semiconductor device such as CMOS device as described in FIG. 1G.

The first hydrogen plasma comprising some charged particles such as protons and electrons is a very strong reducing agent. Therefore, the first hydrogen plasma is capable of removing the impurities in the first barrier layer 182. The first hydrogen plasma may breaks the bonds between impurites and the material of the first barrier layer 182, and then the first hydrogen plasma may combines with the impurities. Thus, the impurities such as oxygen may leave the first barrier layer 182 such that the remaining elements could form new bondings as describes in FIGS. 1E-1F. Thus, the first-treated first barrier layer 182a is modified and densificated by the first hydrogen plasma treatment. Accordingly, the first-treated first barrier barrier layer 182a is an oxygen-deficient first barrier layer.

In another embodiments, the capping layer 180 and the first barrier layer 182 shown in FIG. 3A can be treated with hydrogen plasma respectively. For example, after the capping layer 180 is formed over the gate dielectric layer 172 shown in FIG. 1E, the capping layer 180 is treated with a first hydrogen plasma to form a first-treated capping layer 180a. Next, a first barrier layer is formed over the first-treated capping layer 180a and subsequently treated with a second hydrogen plasma to form a first-treated first barrier layer 182a over the first-treated capping layer 180a to form the overall structure shown in FIG. 3B. In some embodiments, the second hydrogen plasma is generated in an ambient with pure hydrogen gas ($H_2$) or with a diluted hydrogen gas. In some embodiments, the second hydrogen plasma process is similar to the first hydrogen plasma process described above in FIGS. 1E-1F.

Figure 4:
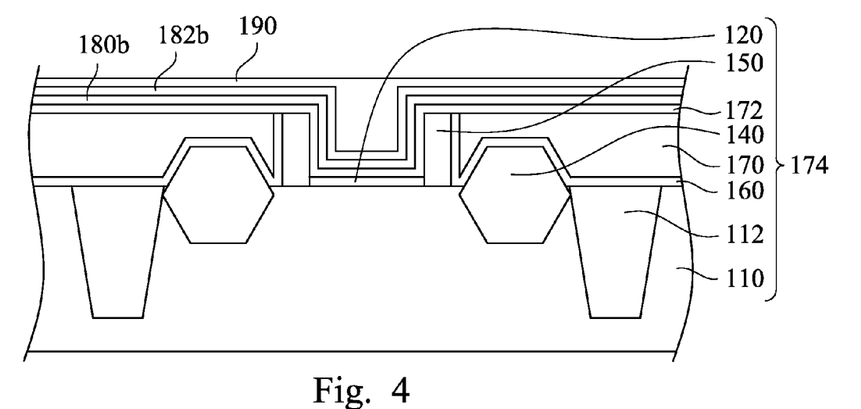
FIG. 4 is a cross-sectional view at a stage of a method of fabricating a gate structure in a semiconductor device in accordance with some embodiments of the instant disclosure.

FIG. 4 is a cross-sectional view at a stage of a method of fabricating a gate structure in a semiconductor device in accordance with some embodiments of the instant disclosure. After the capping layer 180 and the first barrier layer 182 are formed over the gate dielectric layer 172 shown in FIG. 3A, the capping layer 180 and the first barrier layer 182 are treated with a first hydrogen plasma simultaneously and then treated with a first nitrogen plasma simultaneously to form a second-treated capping layer 180b and a second-treated first barrier layer 182b shown in FIG. 4 because the first nitrogen plasma process is a nitriding process. The first nitrogen plasma process provides an environment rich in nitrogen and the nitrogen may diffuses into the nitrogen plasma treated layer. The second-treated capping layer 180b refers to the capping layer treated with hydrogen plasma and nitrogen plasma, and the second-treated first barrier layer 182b refers to the barrier layer treated with hydrogen plasma and nitrogen plasma. Therefore, the second-treated first barrier layer 182b is also oxygen-deficient. A gate layer 190 is subsequently formed over the second-treated first barrier layer 182b. In some embodiments, the first nitrogen plasma is generated in an ambient with nitrogen-containing gas or with diluted nitrogen-containing gas. In some embodiments, the first nitrogen plasma process is similar to that described above in FIG. 2. The gate dielectric layer 172, second-treated capping layer 180b, second-treated first barrier layer 182b and gate layer 190 form a gate stack. In some embodiments, the gate stack is a HKMG stack. Further, the etch stop layer 160, the interlayer dielectric layer 170, the gate dielectric layer 172, the second-treated capping layer 180b, the second-treated first barrier layer 182b and the gate layer 190 shown in FIG. 4 may be further patterned to form a semiconductor device such as CMOS device as described in FIG. 1G.

In another embodiments, the capping layer 180 and the first barrier layer 182 shown in FIG. 3A can be treated with hydrogen plasma and nitrogen plasma respectively. For example, after the capping layer 180 is formed over the gate dielectric layer 172 shown in FIG. 1E, the capping layer 180 is treated with a first hydrogen plasma and a first nitrogen plasma to form the second-treated capping layer 180b shown in FIG. 4. Next, a first barrier layer is formed over the second-treated capping layer 180b and subsequently treated with a second hydrogen plasma and a second nitrogen plasma to form the second-treated first barrier layer 182b over the second-treated capping layer 180b to form the overall structure shown in FIG. 4. In some embodiments, the second nitrogen plasma process is similar to the first nitrogen plasma process described above in FIG. 2.

Figure 5A:
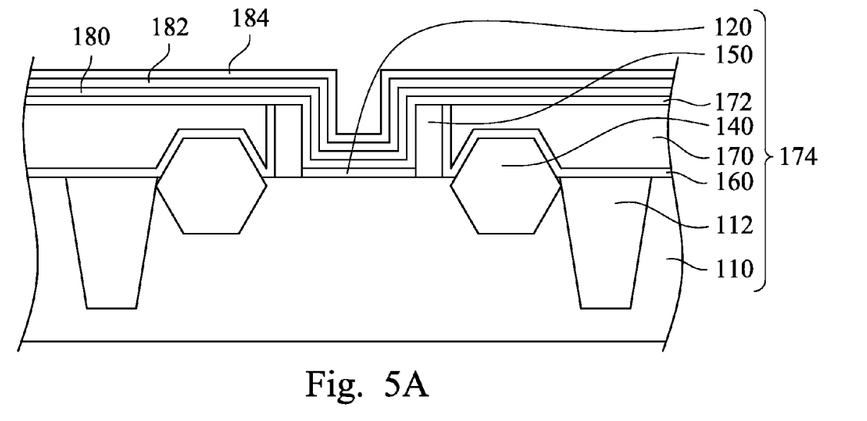
FIGS. 5A to 5B are cross-sectional views at various stages of a method of fabricating a gate structure in a semiconductor device in accordance with some embodiments of the instant disclosure.
Figure 5B:
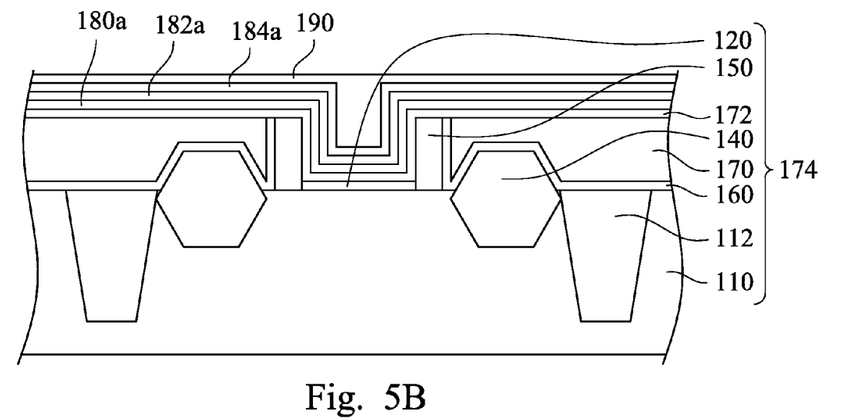

FIGS. 5A to 5B are cross-sectional views at various stages of a method of fabricating a gate structure in a semiconductor device in accordance with some embodiments of the instant disclosure. Referring to FIG. 5A, a first barrier layer 182 is formed over the capping layer 180 and a second barrier layer 184 is subsequently formed over the first barrier layer 182. The first barrier layer 182 and the second barrier layer 184 may be independently formed by atomic layer deposition (ALD), chemical vapor deposition (CVD), low pressure chemical vapor deposition (LPCVD) or monolayer deposition (MLD). The first barrier layer 182 may be made of any suitable material. Examples of the material include but not limited to TiN, TaN, AlN, TiC, TaC, AlC or a combination thereof. The second barrier layer 184 may be made of any suitable material. Examples of the material include but not limited to Mo, Ru, Ti, Os, Re, Rh, Ir, Pt, Ta, In, Cd, Ag, Al, Nb, nitrides of the above-mentioned metals, carbides of the above-mentioned metals, TiN, TaN, AlN, TiC, TaC, AlC, Mo, Ru, Ti or a combination thereof. In some embodiments, the first barrier layer 182 has a thickness less than about 20 angstrom. The second barrier layer 184 has a thickness less than about 50 angstrom.

After the capping layer 180, the first barrier layer 182 and the second barrier layer 184 are formed over the gate dielectric layer 172 shown in FIG. 5A, the capping layer 180, the first barrier layer 182 and the second barrier layer 184 are treated with a first hydrogen plasma simultaneously to form a first-treated capping layer 180a and a first-treated first barrier layer 182a and a first-treated second barrier layer 184a shown in FIG. 5B. The first-treated second barrier layer 184a refers to the second barrier layer treated with hydrogen plasma. Next, a gate layer 190 is formed over the first-treated second barrier layer 184a. The gate dielectric layer 172, first-treated capping layer 180a, first-treated first barrier layer 182a, first-treated second barrier layer 184a and gate layer 190 form a gate stack. In some embodiments, the gate stack is a HKMG stack. Further, the etch stop layer 160, the interlayer dielectric layer 170, the gate dielectric layer 172, the first-treated capping layer 180a, the first-treated first barrier layer 182a, the first-treated second barrier layer 184a and the gate layer 190 shown in FIG. 5B may be further patterned to form a semiconductor device such as CMOS device as described in FIG. 1G.

Because the first hydrogen plasma is capable of removing the impurities in the second barrier layer 184. The first hydrogen plasma may breaks the bonds between impurities and the material of the second barrier layer 184, and then first hydrogen plasma may combines with the impurites. Thus, the impurites such as oxygen may leave the second barrier layer 184 such that the remaining elements could form new bondings as describes in FIGS. 1E-1F. Thus, the first-treated second barrier layer 184*a* is modified and densificated by the first hydrogen plasma treatment. Accordingly, the first-treated second barrier layer 184*a* is an oxygen-deficient second barrier layer.

In another embodiments, the capping layer 180, the first barrier layer 182 and the second barrier layer 184 shown in FIG. 5A can be treated with hydrogen plasma respectively as described in FIG. 3B to form the overall structure shown in FIG. 5B.

Figure 6:
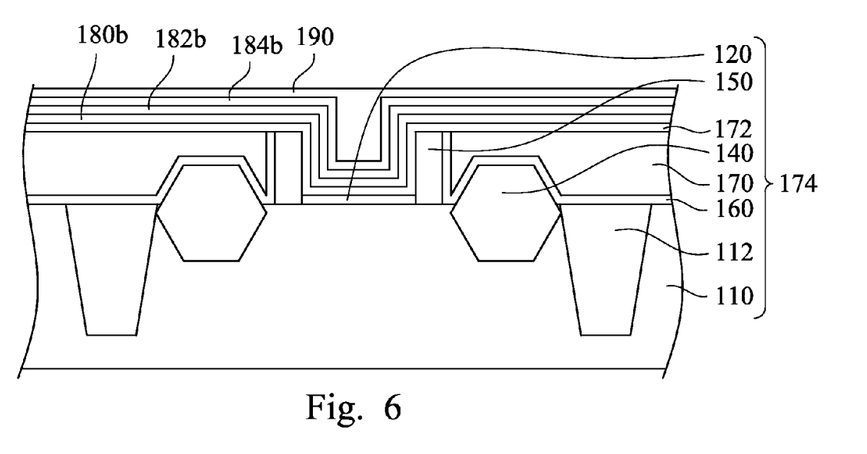
FIG. 6 is a cross-sectional view at a stage of a method of fabricating a gate structure in a semiconductor device in accordance with some embodiments of the instant disclosure.

FIG. 6 is a cross-sectional view at a stage of a method of fabricating a gate structure in a semiconductor device in accordance with some embodiments of the instant disclosure. After the capping layer 180, the first barrier layer 182 and the second barrier layer 184 are formed over the gate dielectric layer 172 shown in FIG. 5A, the capping layer 180, the first barrier layer 182 and the second barrier layer 184 are treated with a first hydrogen plasma simultaneously and then treated with a first nitrogen plasma simultaneously to form a second-treated capping layer 180*b*, a second-treated first barrier layer 182*b* and a second-treated second barrier layer 184*b*. The second-treated second barrier layer 184*b* refers to the second barrier layer treated with hydrogen plasma and nitrogen plasma. Therefore, the second-treated second barrier layer 184*b* is also oxygen-deficient. A gate layer 190 is subsequently formed over the second-treated second barrier layer 184*b*. The gate dielectric layer 172, second-treated capping layer 180*b*, second-treated first barrier layer 182*b*, second-treated second barrier layer 184*b* and gate layer 190 forms a gate stack. In some embodiments, the gate stack is a HKMG stack. Further, the interlayer dielectric layer 170, the gate dielectric layer 172, the second-treated capping layer 180*b*, the second-treated first barrier layer 182*b*, the second-treated second barrier layer 184*b* and the gate layer 190 shown in FIG. 6 may be further patterned to form a semiconductor device as described in FIG. 1G.

In another embodiments, the capping layer 180, the first barrier layer 182 and the second barrier layer 184 shown in FIG. 5A can be treated with hydrogen plasma and nitrogen plasma respectively as described in FIG. 4 to form the overall structure shown in FIG. 6.

FIGS. 1A to 6 respectively describe that these capping layers and/or these barrier layers are treated with the hydrogen plasma and/or the nitrogen plasma. In other words, the instant disclosure also provides a method of modifying a capping layer and a barrier layer in a semiconductor device.

In some embodiments, a semiconductor device may includes semiconductor structures having a capping layer and/or a barrier layer and these semiconductors structures include a gate structure or an interconnection structure. Typically, the interconnection structure includes a via or a contact, and both via and contact include the capping layer and/or the barrier layer. Thus, the method of modifying a capping layer in a semiconductor device of instant disclosure also can be used in middle end of line (MEOL) or back end of line (BEOL). For example, during a fabrication process of via or contact, a capping layer and/or a barrier layer are formed within the via or the contact. Then, the capping layer and/or the barrier layer can be treated with the hydrogen plasma and/or nitrogen plasma as described in FIGS. 1A to 6, after an underlying structure under the capping layer and/or the barrier layer is received. The underlying structure includes but not limited to dielectric layers, interconnection layers or metal layers.

The embodiments of the instant disclosure discussed above have advantages over existing methods and semiconductor devices. Because the hydrogen plasma is a very strong reducing agent, the hydrogen plasma is capable of removing the impurities such as oxygen in the capping layer and barrier layer. The hydrogen plasma can breaks the bonds between the impurities and the material of the capping layer, and the bonds between the impurities and the material of the barrier layer. Next, the hydrogen plasma combines with the impurites. Thus, the impurites may leave the capping layer and the barrier layer such that the remaining elements could form new bondings. In other words, the hydrogen plasma treated capping layer and the hydrogen plasma treated barrier layer are modified and densificated by the hydrogen plasma treatment. As a result, the hydrogen plasma treatment provides an effective way to form a semiconductor device of high quality. Further, the ambient temperature of hydrogen plasma of instant disclosure is much lower than the traditional high temperature annealing process such that the treated capping layer and treated barrier layer can fulfill the requirement of low thermal budget.

Furthermore, after the capping layer and the barrier layer are treated with hydrogen plasma, the capping layer and the barrier layer can be further treated with a nitrogen plasma. The nitrogen plasma provides an environment rich in nitrogen that may diffuses into the nitrogen plasma treated layers. Accordingly, the quality of these nitrogen plasma treated layers can be further enhanced.

The instant disclosure provides a gate structure, a method of fabricating the same and a method of modifying a capping layer in a semiconductor structure, which is beneficial for reducing the thermal budget and obtaining these capping layers and these barrier layer with high quality. Therefore, the performance of semiconductor device may be improved.

In accordance with some embodiments of instant disclosure, a method of fabricating a gate structure in a semiconductor device includes forming a gate dielectric layer over a substrate. A capping layer is formed over the gate dielectric layer. The capping layer is treated with a first hydrogen plasma to form a first-treated capping layer. A gate electrode is formed over the first-treated capping layer.

In accordance with some embodiments of instant disclosure, a method of modifying a capping layer in a semiconductor structure includes receiving an underlying structure. A capping layer is formed over the underlying structure. The capping layer is treated with a first hydrogen plasma to form a first-treated capping layer.

In accordance with some embodiments of instant disclosure, a gate structure includes a substrate, a gate dielectric layer, an oxygen-deficient capping layer and a gate electrode. The gate dielectric layer is over the substrate. The oxygen-deficient capping layer is over the gate dielectric layer. The gate electrode is over the oxygen-deficient capping layer.

The foregoing outlines features of several embodiments so that those skilled in the art may better understand the aspects of the instant disclosure. Those skilled in the art should appreciate that they may readily use the instant disclosure as a basis for designing or modifying other processes and structures for carrying out the same purposes and/or achieving the same advantages of the embodiments introduced herein. Those skilled in the art should also realize that such equivalent constructions do not depart from the spirit and scope of the instant disclosure, and that they may make various changes, substitutions, and alterations herein without departing from the spirit and scope of the instant disclosure.

What is claimed is:

1. A method of fabricating a gate structure in a semiconductor device, the method comprising:
   forming a gate dielectric layer over a substrate;
   forming a capping layer over the gate dielectric layer, and the capping layer comprising TiN, TaN, AlN, SiN, TiC, TaC, AlC, SiC, or a combination thereof;
   treating the capping layer with a first hydrogen plasma to form a first-treated capping layer;
   treating the first-treated capping layer with a first nitrogen plasma; and
   forming a gate electrode over the first-treated capping layer.

2. The method of claim 1, wherein the first nitrogen plasma is generated from a nitrogen-containing gas comprising $NH_3$, $N_2$ or both.

3. The method of claim 1, wherein the first hydrogen plasma has a power in a range of 250 to 2000 W.

4. The method of claim 1, further comprising a dilution gas in the first hydrogen plasma.

5. The method of claim 1, further comprising forming a first barrier layer over the capping layer and treating the first barrier layer with the first hydrogen plasma to form a first-treated first barrier layer.

6. The method of claim 5, further comprising treating the first-treated first barrier layer with the first nitrogen plasma.

7. The method of claim 1, further comprising forming a first barrier layer over the first-treated capping layer and treating the first barrier layer with a second hydrogen plasma to form a first-treated first barrier layer.

8. The method of claim 7, further comprising treating the first-treated first barrier layer with a second nitrogen plasma.

9. The method of claim 1, wherein treating the first-treated capping layer with the first nitrogen plasma comprises:
   performing a nitriding process to the first-treated capping layer.

10. The method of claim 1, wherein treating the first-treated capping layer with the first nitrogen plasma comprises:
    diffusing nitrogen into the first-treated capping layer.

11. A method of modifying a capping layer in a semiconductor structure, the method comprising:
    receiving an underlying structure;
    forming a capping layer over the underlying structure, and the capping layer comprising TiN, TaN, AlN, SiN, TiC, TaC, AlC, SiC, or a combination thereof;
    treating the capping layer with a first hydrogen plasma and a nonionized dilution gas to form a first-treated capping layer; and
    treating the first-treated capping layer with a first nitrogen plasma.

12. The method of claim 11, further comprising forming a first barrier layer over the capping layer and treating the first barrier layer with the first hydrogen plasma to form a first-treated first barrier layer.

13. The method of claim 12, further comprising treating the first-treated first barrier layer with the first nitrogen plasma.

14. The method of claim 11, further comprising forming a first barrier layer over the first-treated capping layer and treating the first barrier layer with a second hydrogen plasma to form a first-treated first barrier layer.

15. The method of claim 14, further comprising treating the first-treated first barrier layer with a second nitrogen plasma.

16. A gate structure, comprising:
    a substrate;
    a gate dielectric layer over the substrate;
    an oxygen-deficient capping layer having a surface sequentially treated with a hydrogen plasma and a nitrogen plasma, over the gate dielectric layer, and the oxygen-deficient capping layer comprising TiN, TaN, AlN, SiN, TiC, TaC, AlC, SiC, or a combination thereof; and
    a gate electrode over the surface of the oxygen-deficient capping layer.

17. The gate structure of claim 16, further comprising an oxygen-deficient first barrier layer over the oxygen-deficient capping layer.

18. The gate structure of claim 17, further comprising an oxygen-deficient second barrier layer over the oxygen-deficient first barrier layer.

19. The gate structure of claim 16, further comprising an oxygen-deficient first barrier layer between the oxygen-deficient capping layer and the gate electrode.

20. The gate structure of claim 18, wherein the oxygen-deficient second barrier layer comprises Mo, Ru, Ti, Os, Re, Rh, Ir, Pt, Ta, In, Cd, Ag, Al, Nb, nitrides thereof, carbides thereof, or a combination thereof.

* * * * *